United States Patent
Shimizume

[11] Patent Number: 5,923,200
[45] Date of Patent: Jul. 13, 1999

[54] PHASE MODULATOR CIRCUIT

[75] Inventor: Kazutoshi Shimizume, Kanagawa, Japan

[73] Assignee: Sony Corporation, Japan

[21] Appl. No.: 08/532,306

[22] Filed: Sep. 22, 1995

[30] Foreign Application Priority Data

Sep. 30, 1994 [JP] Japan ................................ 6-237084

[51] Int. Cl.[6] .................................................. H03H 11/26

[52] U.S. Cl. .......................... 327/277; 327/158; 327/244; 327/270; 327/276

[58] Field of Search ................................. 327/2, 3, 5, 72, 327/231, 236, 237, 234, 241, 244, 269, 270, 4, 27, 42, 147, 149, 156, 158, 238, 254, 258, 295, 356, 276, 277

[56] References Cited

U.S. PATENT DOCUMENTS

| | | | |
|---|---|---|---|
| 4,309,649 | 1/1982 | Naito | 327/2 |
| 4,339,823 | 7/1982 | Predina et al. | 375/20 |
| 4,873,491 | 10/1989 | Wilkins | 327/3 |
| 4,922,141 | 5/1990 | Lofgren et al. | 327/276 |
| 5,646,564 | 7/1997 | Erickson | 327/158 |

Primary Examiner—Timothy P. Callahan
Assistant Examiner—Jung Ho Kim
Attorney, Agent, or Firm—Ronald P. Kananen; Rader, Fishman & Grauer

[57] ABSTRACT

An input signal and a signal obtained by delaying that input signal are compared, an output signal is produced based on the amount of the delay, and the output signal is used to form a control signal by a low pass filter. The delay of the input signal is controlled so as to produce a plurality of stable clocks and enable stable high speed signal processing without raising the clock frequency.

6 Claims, 9 Drawing Sheets

FIG. 4
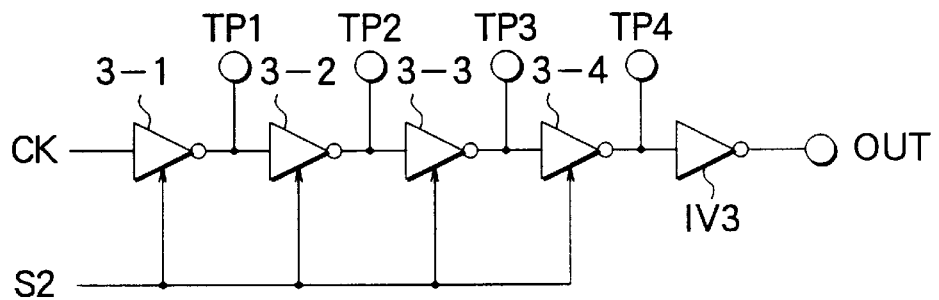
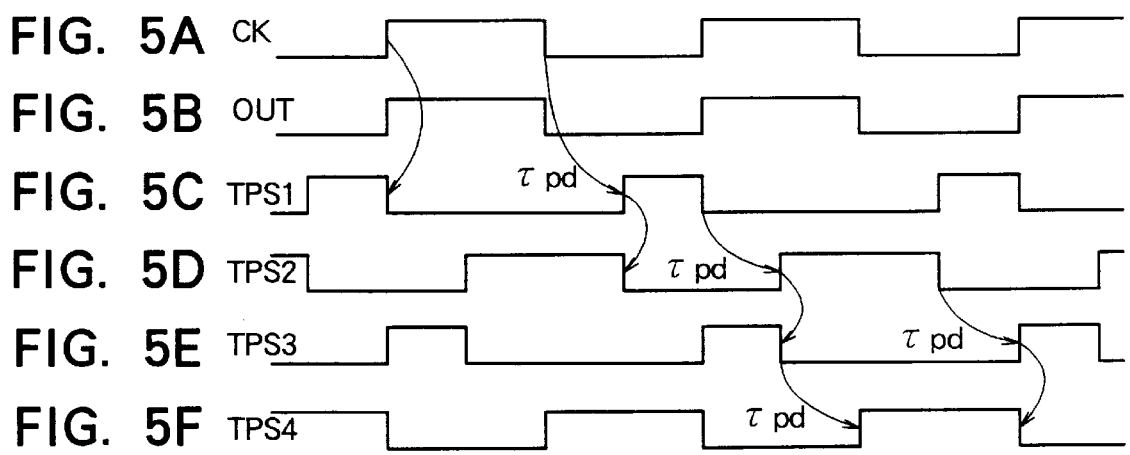
FIG. 5A CK
FIG. 5B OUT
FIG. 5C TPS1
FIG. 5D TPS2
FIG. 5E TPS3
FIG. 5F TPS4

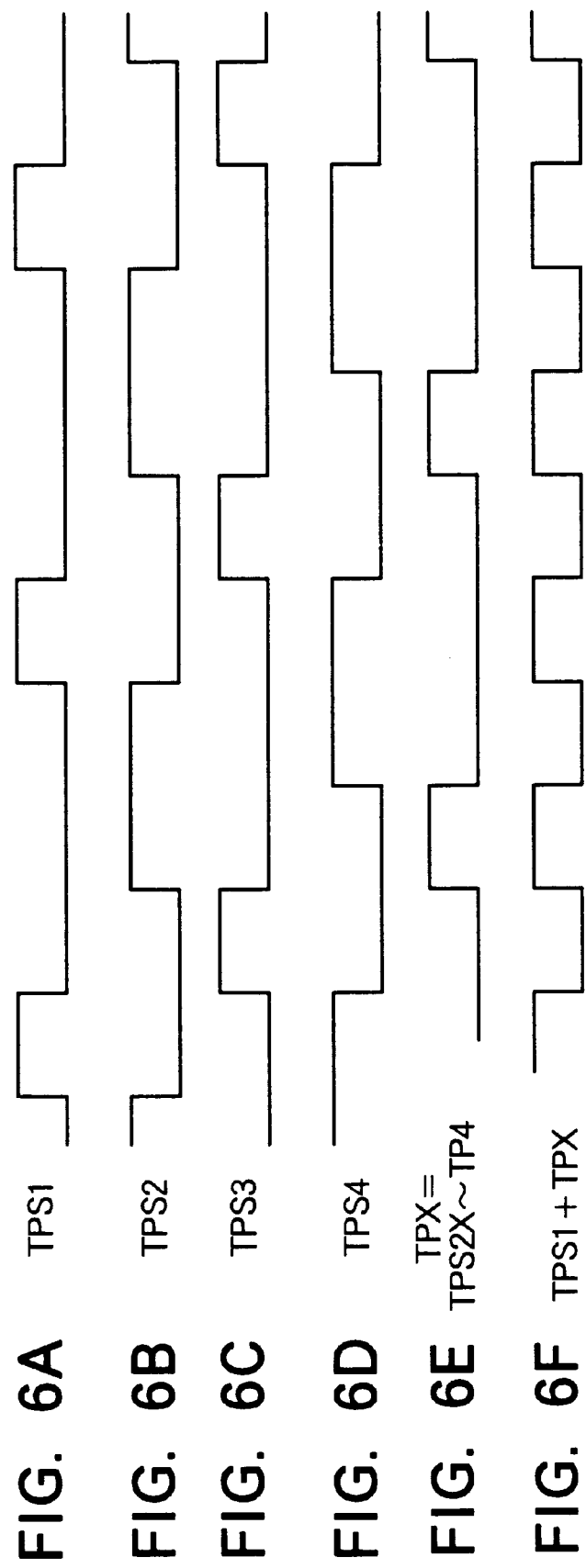

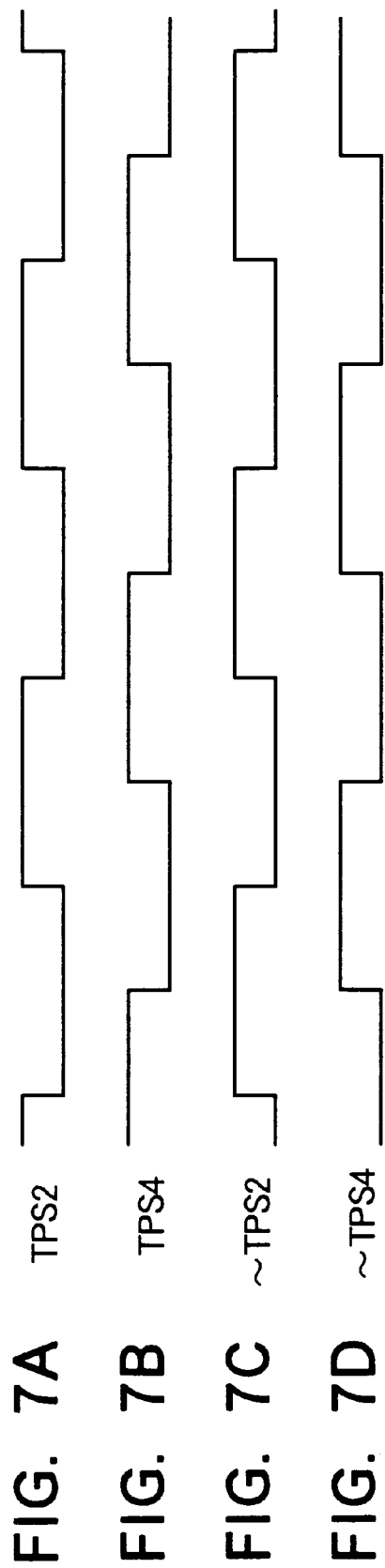
FIG. 7A  TPS2
FIG. 7B  TPS4
FIG. 7C  ~TPS2
FIG. 7D  ~TPS4

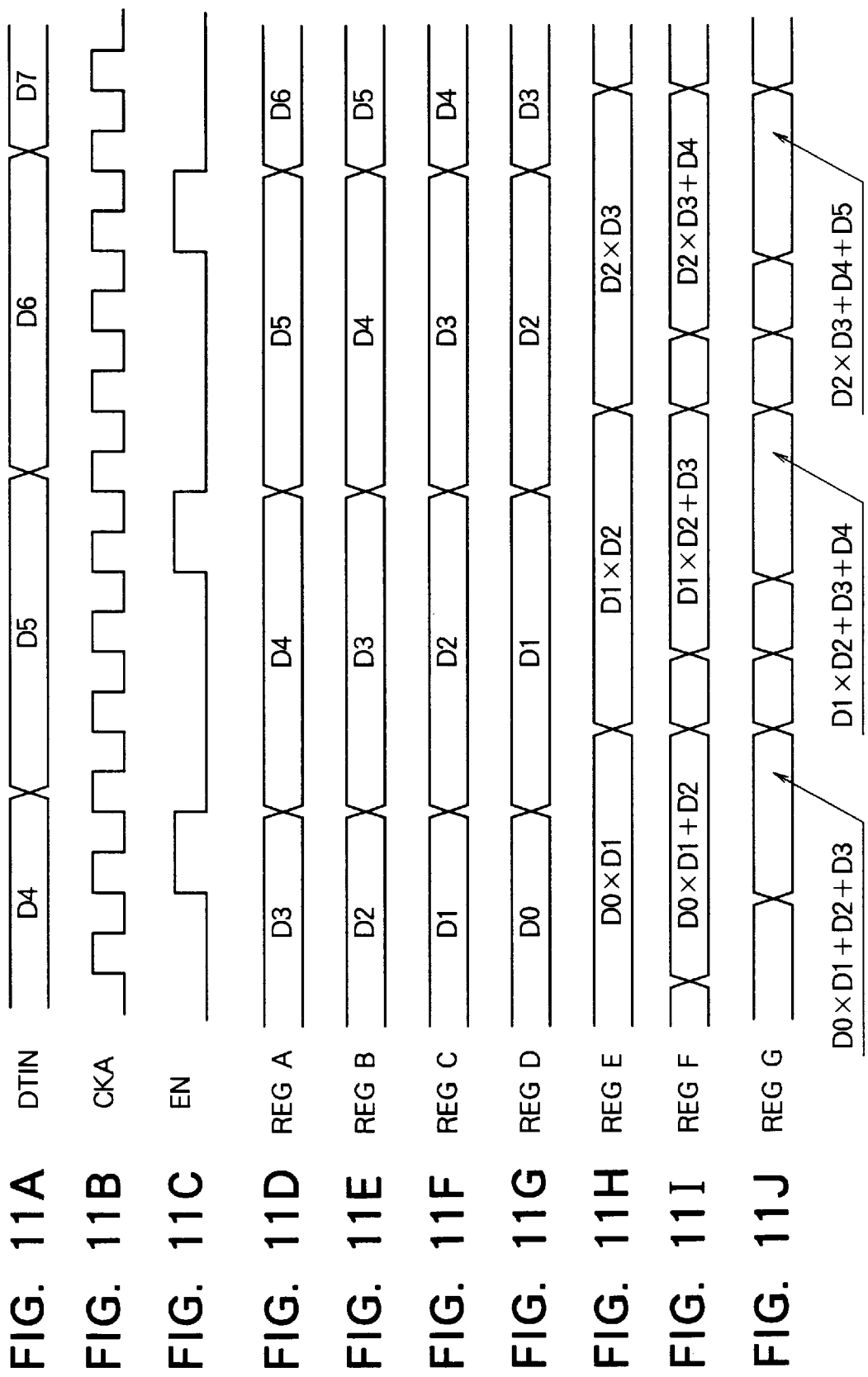

PHASE MODULATOR CIRCUIT

BACKGROUND OF THE INVENTION

1. Field of the Invention

The present invention relates to a phase modulator circuit for producing from a reference signal several types of signals with different phase differences.

2. Description of the Related Art

In general, in the past, signal processing has been designed based on the assumption of completely synchronous processing. The clock signal in the circuit was used for all processing events on the time axis. Therefore, it was difficult to establish a processing timing of a time shorter than the clock frequency, for example. Accordingly, to produce such a shorter processing timing, use was made of the method of raising the clock frequency. The method of producing processing timings by raising the clock frequency, however, had the problem of increasing the power consumption.

Further, in the past, use has been made of delay elements using capacitors C and resistors R to produce timings shorter than the clock frequency or timings indivisible by whole multiples of the clock frequency. The method of using delay elements suffered from the problem that the constant changed several tens of percent when the delay times are generated in an LSI and further changed considerably due to temperature and the voltage of the power source, so a stable amount of delay could not be obtained.

SUMMARY OF THE INVENTION

A first object of the present invention is to enable production of a signal with any delay and stable with respect to the input signal.

A second object of the present invention is to provide a phase modulator circuit which enables stable high speed signal processing without raising the clock frequency of the signal processing circuit.

To achieve the above objects, the phase modulator circuit of the present invention is provided with a phase comparing means for detecting the phase difference between a first signal and second signal and outputting a signal in accordance with the results of detection, a delay control signal producing means for receiving the output signal of the phase comparing means and producing a delay control signal of a level in accordance with the level of that signal, and a phase shifting means for receiving the delay control signal, delaying the first signal by an amount of delay in accordance with the level of the input, and outputting the result as the second signal.

In the phase modulator circuit of the present invention, the phase shifting means is comprised of a cascade connection of a plurality of unit cells including inverters for adjustably varying the amount of delay of the delay control signal. Signal fetching taps are connected to the outputs of the unit cells.

The unit cells are comprised of cascade connections of at least three inverters constituted by a P-channel MOS transistor and N-channel MOS transistor connected in series between a first power source and a second power source. The delay control signal is supplied to the gate of the P-channel MOS transistor of the initial stage inverter, while the first signal is supplied to the gate of the N-channel MOS transistor.

In the phase modulator circuit of the present invention, the first signal is input to the phase comparing means and the phase shifting means.

The first signal input to the phase shifting means is given a delay of exactly the time corresponding to the input level of the delay control signal and is output to the phase comparing means as the second signal.

Here, for example, when the rising edge of the second signal output from the phase shifting means is advanced from the rising edge of the first signal, a high level signal is output from the phase comparing means to the delay control signal producing means. Due to this, a high level delay control signal is produced and output from the delay control signal producing means to the phase shifting means.

As a result, the amount of the delay of the phase shifting means becomes greater and the second signal becomes delayed in phase.

Converse to this, when the rising edge of the second signal output from the phase shifting means is delayed from the rising edge of the first signal, a low level signal is output from the phase comparing means. Along with this, a low level delay control signal is produced and output from the delay control signal producing means to the phase shifting means.

As a result, the amount of the delay of the phase shifting means is reduced and the second signal becomes advanced in phase.

In this way, this circuit operates so that the second signal is delayed when advanced in phase from the first signal and is advanced when delayed. In a stable state, the first signal and the second signal coincide in phase.

BRIEF DESCRIPTION OF THE DRAWINGS

These and other objects and features of the present invention will become clearer from the following description of the preferred embodiments given with reference to the attached drawings, in which:

FIG. 4 is a circuit diagram of a variable phase shifter comprised of four unit cells with a signal inverter connected to the output thereof;

FIGS. 5A to 5F are timing charts of the circuit of FIG. 4;

FIGS. 6A to 6F are timing charts for explaining a frequency multiplication circuit of a fifth embodiment of the present invention;

FIGS. 7A to 7D are timing charts for explaining a rotational phase clock produced by the phase modulator circuit according to the present invention;

FIGS. 11A to 11J are timing charts of FIG. 10.

DESCRIPTION OF THE PREFERRED EMBODIMENTS

Figure 1:
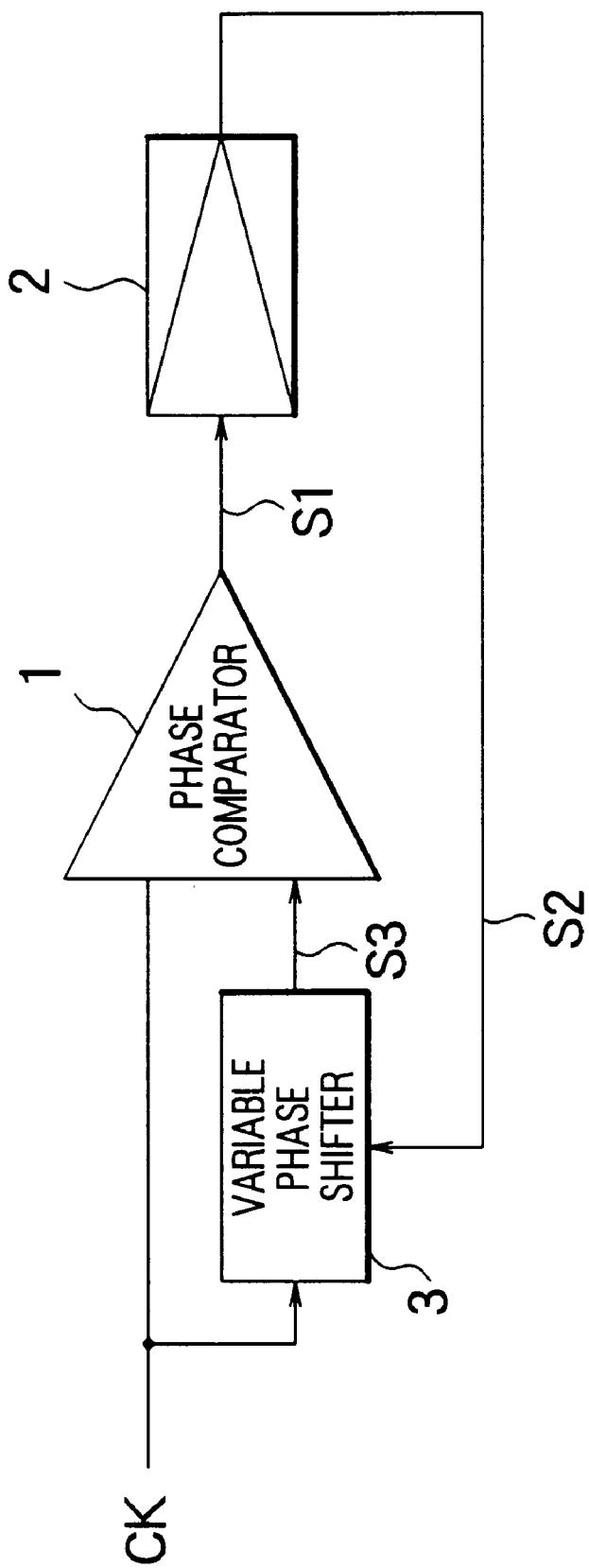
FIG. 1 is a block diagram of a first embodiment of a phase modulator circuit according to the present invention.

FIG. 1 is a block diagram of a first embodiment of a phase modulator circuit according to the present invention.

In FIG. 1, 1 denotes a phase comparator, 2 denotes a low pass filter, 3 denotes a variable phase shifter, and CK denotes an input clock signal.

The phase comparator 1 is one used in a general PLL circuit and the like. It detects the phase difference between two input signals, specifically the input clock signal CK and the output signal S3 of the variable phase shifter 3, and outputs a signal S1 corresponding to the results of the detection to the low pass filter 2.

For example, if the clock signal CK and the signal S3 are the same in phase, a high impedance (High-Z) signal S1 is output. If the rising edge of the signal S3 is advanced from the rising edge of the clock signal CK, a high level signal S1 is output. If the rising edge of the signal S3 is delayed from the rising edge of the clock signal CK, a low level signal S1 is output.

The low pass filter 2 extracts the DC component from the output signal S1 of the phase comparator 1 and outputs a delay control signal S2 to the variable phase shifter 3.

The variable phase shifter 3 gives to the clock signal CK an amount of delay corresponding to the voltage of the delay control signal S2 output from the low pass filter 2 and outputs the result as the signal S3 to the phase comparator 1.

That is, the variable phase shifter 3 is a circuit for changing the delay time between the input and output in accordance with the value of the voltage of the delay control signal S2. For example, when the control voltage becomes higher, the amount of the delay becomes greater, while when it becomes lower, the amount of delay becomes smaller.

In such a configuration, the clock signal CK is input to one of the input ends of the phase comparator 1 and to the variable phase shifter 3.

The clock signal CK input to the variable phase shifter 3 is delayed by exactly the time corresponding to the value of the input voltage of the delay control signal S2 and then is input to the other input end of the phase comparator 1 as the signal S3.

When the rising edge of the output signal S3 of the variable phase shifter 3 is advanced from the rising edge of the clock signal CK, a high level signal S1 is output from the phase comparator 1 to the low pass filter 2. Due to this, the output of the low pass filter 2 also shifts in potential to the high level side. This potential is input as the delay control signal S2 to the variable phase shifter 3.

As a result, the amount of delay of the variable phase shifter 3 becomes larger and the output signal S3 becomes delayed in phase.

Converse to this, when the rising edge of the output signal S3 of the variable phase shifter 3 is delayed from the rising edge of the clock signal CK, a low level signal S1 is output from the phase comparator 1. Along with this, the output of the low pass filter 2 shifts in potential to the low level side.

As a result, the amount of delay of the variable phase shifter 3 becomes smaller and the output signal S3 becomes advanced in phase.

In this way, this circuit operates so that the signal output from the variable phase shifter 3 is delayed when advanced in phase from the input clock signal CK and becomes advanced when delayed. In a stable state, the input clock signal CK and the signal S3 output from the variable phase shifter 3 coincide in phase.

Note that in the above explanation, reference was made to the input of a clock signal CK, but the same applies to any signal.

Now, the relationship among the phase difference between the input clock signal CK and the output signal S3 of the variable phase shifter 3, the polarity of the output level of the phase comparator 1, the polarity of the control voltage of the variable phase shifter 3, and the amount of shift explained here is not inherent to the invention. The important point is that the phase difference between the clock signal Ck and the signal S3 becomes smallest in the state where the system is stable.

Next, a more detailed explanation will be given of the variable phase shifter 3 for adjustment of the phase difference.

Figure 2:
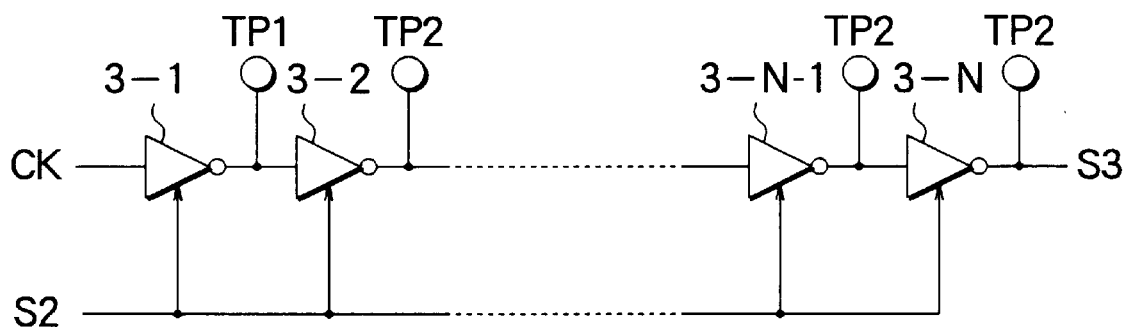
FIG. 2 is a circuit diagram of a specific example of the configuration of a variable phase shifter of a second embodiment of the present invention.

FIG. 2 is a circuit diagram of a specific example of the configuration of a variable phase shifter of a second embodiment of the present invention.

Figure 3:
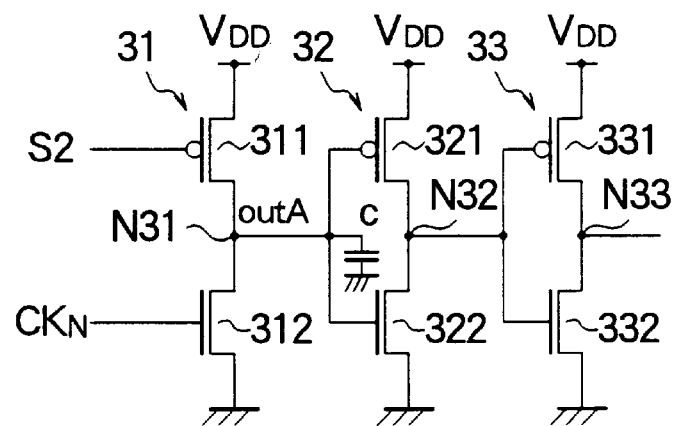
FIG. 3 is a circuit diagram of a specific example of the configuration of a unit cell of FIG. 2.

In FIG. 2, 3-1, 3-2, . . . , 3-N-1, and 3-N are unit cells comprised of inverters, and TP1, TP2, . . . , TPN-1, and TPN are intermediate output taps.

The variable phase shifter 3, as shown in FIG. 2, is comprised of the N number of unit cells 3-1 to 3-N connected in cascade. The unit cells 3-1 to 3-N are supplied with the output of the low pass filter 2, that is, the delay control signal S2.

The clock signal CK is input to the unit cell 3-1. The intermediate output taps TP1 to TPN are connected to the outputs of the unit cells 3-1 to 3-N.

FIG. 3 is a circuit diagram of a specific example of the configuration of, a unit cell of FIG. 2.

As shown in FIG. 3, a unit cell is comprised of a cascade connection of three inverters 31, 32, and 33.

The inverters 31 to 33 are comprised of the PMOS transistor 311 and NMOS transistor 312, the PMOS transistor 312 and the NMOS transistor 322, and the PMOS transistor 331 and NMOS transistor 332 connected in series between the supply line of the power source voltage $V_{DD}$ and the ground.

The gate of the PMOS transistor 311 of the initial stage inverter 31 is connected to the input line of the delay control signal S2, while the gate of the NMOS transistor 312 is connected to the input line of the clock signal $CK_N$. The node N31 of the drains of the PMOS transistor 311 and the NMOS transistor 312 is connected to the gates of the PMOS transistor 322 and the NMOS transistor 322 of the second stage inverter 32. Further, the node N32 of the drains of the PMOS transistor 321 and the NMOS transistor 322 of the inverter 32 is connected to the gates of the PMOS transistor 331 and the NMOS transistor 332 of the third stage inverter 33. Further, the node N33 of the drains of the PMOS transistor 331 and the NMOS transistor 332 is connected to the output end of the unit cell.

The unit cell of this configuration is supplied at the gate of the NMOS transistor 312 with an input clock signal $CK_N$ at the portion where the initial stage inverter 31 controls the amount of delay.

When the input level of the clock signal $CK_N$ changes from the low level to the high level, the NMOS transistor 312 becomes ON, so the charge of the capacitance C stored up to then is instantaneously discharged and the initial output outA changes to the low level (ground level).

Next, when the input changes from the high level to the low level, the NMOS transistor 312 switches from the ON state to the OFF state, so the initial output outA rises from the 0V (low level) to the power source voltage $V_{DD}$ by charging by the capacitance C through the PMOS transistor 311.

The charging time at this time, however, is determined by the time constant between the ON resistance Ron and the capacitance C of the PMOS transistor 311. Here, C is a constant determined by the LSI pattern.

The ON resistance Ron changes due to the gate voltage of the PMOS transistor 311. In the end, the closer the value of the voltage of the delay control signal S2 to 0V, the smaller the ON resistance Ron and the smaller the amount of the delay.

Opposite to this, the closer the value of the voltage of the delay control signal S2 to the power source voltage $V_{DD}$, the larger the ON resistance Ron and the larger the amount of the delay.

The output outA of the initial stage inverter 31 is input to the initial stage inverter 32, so the amount of delay is not affected by the load capacitance of the unit circuit. Further, this unit circuit as a whole (three-stage inverter) is configured so as to operate as an inversion circuit.

By connecting an even number of these unit circuits, it becomes possible to add the same amount of delay in both the rising edge and trailing edge of an input.

The following characteristics are apparent from FIG. 1.

That is, the signal S3 output from the variable phase shifter 3 is a signal delayed by exactly the input clock signal CK. It matches completely in frequency.

Further, the phase of the input of the variable phase shifter 3 also coincides in the state where the system is stable. In other words, the circuit of FIG. 1 can be said to be a locked loop circuit for ensuring coincidence of the phase of the input and output of the variable phase shifter 3.

Next, the circuit of FIG. 2 will be explained in further detail.

Here, the input and output of the variable phase shifter 3 are assumed to already coincide in phase. However, even if coinciding in phase, there are several lock points of phase delays of the actual output of whole multiples of 360° from the input.

Here, however, it is assumed that use is made of only the lock point with the smallest amount of delay among the plurality of lock points. Therefore, the circuit can be easily realized by limiting the range of variation of the voltage of the delay control signal S2 or limiting the maximum delay of the variable shift register 3.

Below, an explanation will be made of two types of registers. An even number of the unit cells, however, is assumed so as to make the delay of the rising edge and trailing edge of the shifter output equal.

First, an explanation will be made of the case of an even number of unit cells of the shifter and a normal relationship between the input and output.

When the system is stable, the input and output of the variable phase shifter 3 become the same in phase and the total delay d of the shifter becomes a whole multiple of the period of the input clock. Further, the system stabilizes under the conditions shown by the following equation:

$$d=nT \quad (T \text{ is the clock period}) \tag{1}$$

Here, the delay τpd of the rising edge of one unit cell becomes that shown by the following equation:

$$\tau pd = K \times Ron \times C \tag{2}$$

where, K is a proportional constant

Since the rising/trailing edges of two unit cells are delayed by τpd each, the total delay d can be expressed by the following equation:

$$d=(N \times \tau pd)/2 \tag{3}$$

Here, N is the number of the unit cells and n is an integer of 1 or more, but assuming that n=1 from the previous means, the total delay d of the shifter becomes T and in the end the following equation is obtained:

$$\tau pd=(2 \times T)/N \tag{4}$$

Further, if M=N/2, M becomes the number of pairs of unit cells and in the end the delay τpd becomes expressed by the following equation:

$$\tau pd=T/M \tag{5}$$

From equation (5), it is learned that the delay τpd is equal to T divided by the number M of the pairs of unit cells.

Next, an explanation will be given of the case of an even number of unit cells of the shifter and an inverted relationship between the input and output.

That is, the explanation will be made of the case where the input and output of the variable phase shifter 3 are reverse in phase.

This case corresponds to the case of a serial connection of an even number of unit cells and a single inverter. The point where the delay stabilizes is where the rising edge of the input clock signal CK and the trailing edge of the output signal S3 of the variable phase shifter 3 coincide.

The delay d of the variable phase shifter 3 is expressed by the following equation. The system stabilizes under these conditions.

$$d=(0.5+n) \times T \tag{6}$$

where, n is an integer of 0 or more, and f is the clock frequency.

Here to, n is assumed to be the minimum 0.

In the same way as above, the delay τpd is expressed by the following equation:

$$\tau pd=T/(2 \times M) \tag{7}$$

As will be understood from equation (7) and equation (5), when the relationship between the input and output is an inverted one, it is possible to make the delay τpd smaller compared with the case where the relationship is normal.

Further, consider the case of four unit cells and an inverted relationship between the input and output of a fourth embodiment of the present invention.

That is, the explanation will be made of the case of four unit cells 3-1 to 3-4 of the variable phase shifter 3 and connection of one inverter IV1 to the output while referring to FIG. 4 and FIGS. 5A to 5F.

In this example, the input and output of the variable phase shifter 3 are inverted in phase, so the example corresponds to the case of equation (6) (in the above method, n was already set to 0). This equation (6) becomes τpd=T/4 when T is the clock period and n=0. The system stabilizes with this delay.

FIGS. 5A to 5F are timing charts of this.

As will be understood from FIGS. 5A to 5F, when the system is stable, the output of the variable phase shifter 3 becomes the same in phase as the input clock signal CK and the delay τpd of the rising edge is ¼ T.

Above, the explanation was made with reference to control of the delay. Below, the explanation will be made of various applications of use of the delay signals TPS1 to TPS4 while referring to FIG. 4 and FIGS. 5A to 5F.

From FIGS. 5A to 5F, it will be understood that the signal delayed by exactly T/4 from the clock signal CK serving as the reference is TPS2. By changing the number N of the unit cells, the amount of the delay can be changed in various ways.

Further, the amount of the delay is extremely stable even in the face of changes in the power source voltage, ambient temperature, etc. It is therefore possible to obtain a highly reliable delay circuit.

In addition, this delay circuit has the feature not present in conventional delay circuits of not changing in the phase angle even if the clock frequency changes.

Next, an explanation will be made of a frequency multiplication circuit of a fifth embodiment of the present invention while referring to FIGS. 6A to 6F.

In FIGS. 6A to 6F, the signal of the conjunction of the inverted signals of TPS2 and TPS4 is made TPX to prepare a signal comprised of the disjunction of TPX and TPS1. This signal is multiplied to two times the frequency of the clock signal CK.

In this way, by changing the number N of the unit cells, it is possible to realize a multiplication circuit giving any multiple. Further, this multiplication circuit is extremely stable even with respect to changes in the power source voltage, ambient temperature, and so forth. It is possible to obtain a highly reliable multiplication circuit.

In addition, this multiplication circuit has the feature not present in conventional delay circuits of not changing in the rate of multiplication even if the clock frequency changes.

Next, an explanation will be made of the rotational phase clock while referring to FIGS. 7A to 7D.

In FIGS. 7A to 7D, the signal shifted in phase 90° from the clock signal CK in FIG. 5 is TPS2, the signal shifted in phase 180° is TPS4, and the signal shifted in phase 270° is TPS2. The signal shifted in phase 360° is the inverted signal of TPS4. The order is shifted in phase every 90°. It is deemed that the phase is rotated every 90°.

That is, despite the fact that these signals are the same in frequency as the input clock frequency, it is possible to obtain four times the quantum events on the time axis.

That is, four times the signal processing slots are obtained.

Below, an explanation will be made of the fact that it is possible to reduce the power consumption of a signal processing circuit using the rotational phase clock of the present invention while referring to the circuits and timing charts of FIG. 8 to FIGS. 11A to 11J.

Note that the names of the signals of the rotational phase clocks are made CKA to CKD here.

Figure 8:
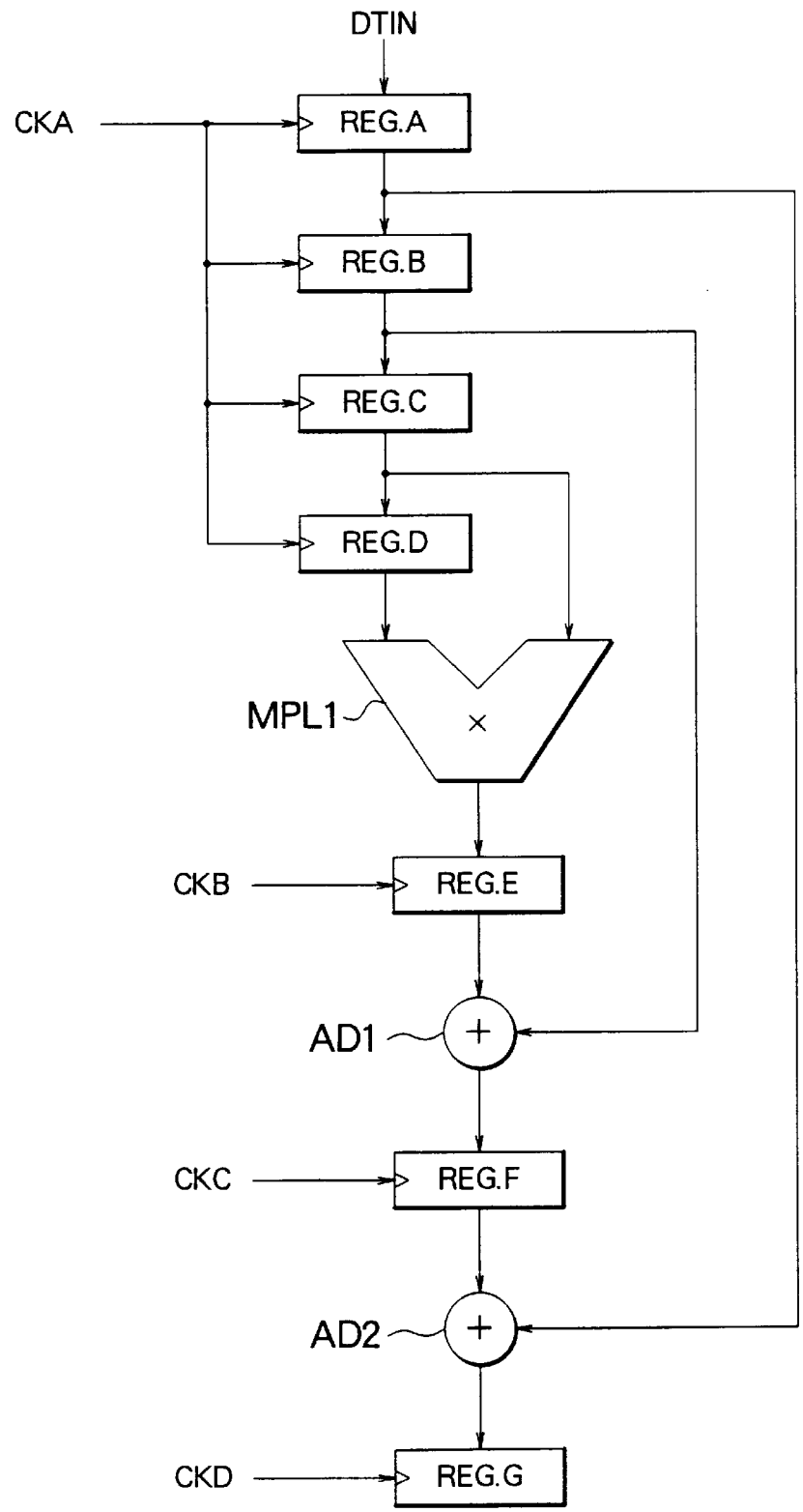
FIG. 8 is a view of an example of a signal processing circuit using a rotational phase clock of a sixth embodiment of the present invention.

FIG. 8 is a view of an example of a signal processing circuit using a rotational phase clock of a sixth embodiment of the present invention, while FIGS. 9A to 9L are timing charts of FIG. 8.

In FIG. 8, REG.A to REG.G are registers, MLP1 is a multiplier, and AD1 and AD2 are adders.

In this circuit, 8-bit data, for example, is input serially every input DTIN. The computation $$(Di) \times (Di+1) + (Di+2) + (Di+3)$$

is performed by pipeline processing. Note that this processing has no meaning at all here. The object of the processing is to verify that the processing is more advantageous in terms of power consumption and clock skew compared with the case when it is performed by typical conventional processing.

Figure 10:
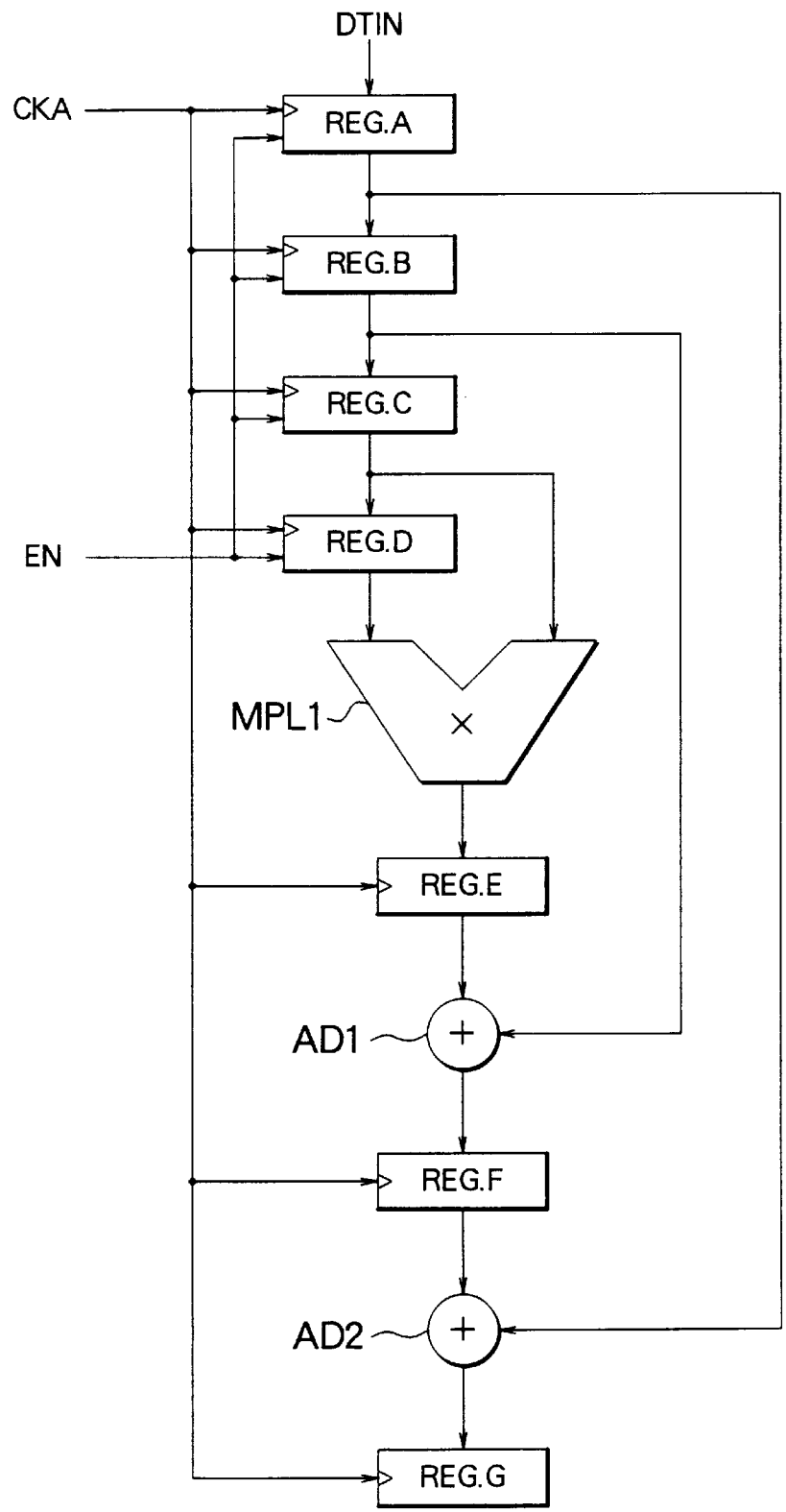
FIG. 10 is a view of an example of a signal processing circuit of a related art for comparison with the sixth embodiment of the present invention shown in FIG. 8.

FIG. 10 is a view of a circuit performing the same processing at the same speed as the above circuit based on a conventional typical technique, while FIGS. 11A to 11J are timing charts of FIG. 10.

The operation will be explained below step by step.

First, an explanation will be given of the operation of the circuit of FIG. 8 referring to FIGS. 9A to 9L.

Here, the input DTIN is assumed to be given at periods of the clock signal CKA. The data is shifted by the clock signal CKA from the REG.A to REG. D (each 8-bit registers).

Figure 9:
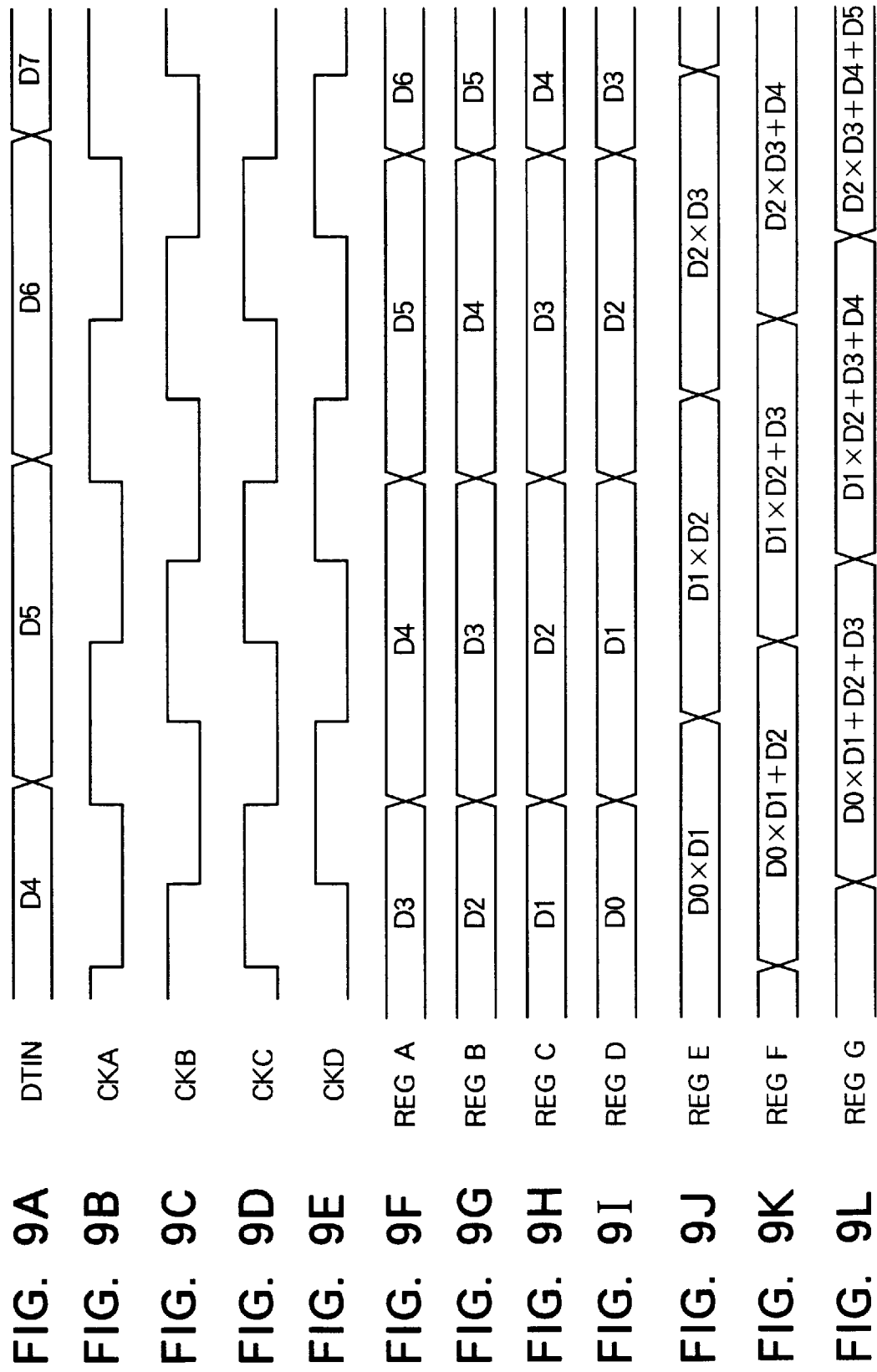
FIGS. 9A to 9L are timing charts of FIG. 8.

As shown in FIG. 9, for example, when the register REG.A is D4, the register REG.B is D3, the register REG.C is D2, and the register REG.D is D1. At this time, the register REG.E fetches the result of multiplication by the multiplier MLP1 of the register REG.C and the register REG.D by the clock signal CKB.

Further, the register REG.F fetches the result of addition by the adder AD1 of the register REG.E and the register REG.B by the clock signal CKC. The final register REG.G fetches the result of addition by the adder AD2 of the register REG.F and the register REG.A by the clock signal CKD.

Finally, the register REG.F can give $$(Di) \times (Di+1) + (Di+2) + (Di+3)$$

every period of input DTIN.

Next, an explanation will be made of the operation of a typical signal processing circuit in ordinary use referring to FIG. 10 and FIGS. 11A to 11J.

In this circuit, a clock signal of a frequency four times the clock signal CKA is given to all of the registers REG.A to REG.G.

The registers REG.A to D are controlled by the new enable signal SN and perform the same operation as the registers REG.A to REG.D in the circuit of FIG. 8.

Finally, in the register REG.F, like with the register REG.F, it is possible to obtain the same results of computations each period of input DTIN.

From the above explanation, it is understood that the circuit of FIG. 8 and the circuit of FIG. 10 realize the same operation at the same signal processing speed.

Here, an explanation will be given of the power consumption of the two clock circuits of FIG. 8 and FIG. 10. Note that it is assumed that the wiring capacitance and the input capacitance of the flipflop of the load of the clock circuit are assumed to be the same in both circuits. That is, the load capacitance of the clock driver driving the register REG.A is made CL and the clock circuits of the other register are made equal to CL. Further, the clock circuits of all the registers in FIG. 8 and FIG. 10 are assumed to have the load capacitance of CL. Based on this assumption, it is possible to fairly evaluate the circuits.

Now, in the circuit of FIG. 8, the clock signal CKA drives four registers, while the clock signals CKB, CKC, and CKD each drive one register. The clock frequencies are made f. The total power consumption $Pd_8$ of the clock circuit is given by the following equation:

$$Pd_8 = 7 \times CL \times f \times (V_{DD})^2 \tag{8}$$

On the other hand, in the circuit of FIG. 10, since f is four times greater, the total power consumption $Pd_{10}$ is given by the following equation:

$$Pd_{10} = 7n \times CL \times (4 \times f) \times (V_{DD})^2 \tag{9}$$

giving a power consumption four times the circuit of FIG. 8.

As explained above, according to this embodiment, despite the clock being low in frequency, it is possible to realize high speed signal processing with a low power consumption by shifting the phase.

As explained above, according to the phase modulator circuit of the present invention, it is possible to raise the speed of signal processing with a low power consumption and without raising the system clock frequency of the circuit.

Further, with the delay circuit used in this circuit, it becomes possible to achieve a constant delay even with changes in the transistor characteristics or load capacitance.

Still further, it becomes possible to construct a multiplication circuit for the reference signal by producing from a reference signal a plurality of signals with different amounts of shift and gate processing these signals.

What is claim is:

1. A phase modulator circuit, comprising:
   a phase comparator for detecting a phase difference between a first signal and a reference clock signal and outputting a signal in accordance with said detection,
   a delay control signal producing circuit for receiving said output signal of the phase comparator and producing a delay control signal in accordance with a voltage level of said phase comparator output signal, and
   a variable phase shifter for receiving said delay control signal, delaying said reference clock signal by an amount of delay in accordance with said delay control signal to generate said first signal,
   wherein said variable phase shifter comprises a plurality of cells each of which delays said reference clock signal by a predetermined amount,
   wherein each of said cells comprises three inverters connected in cascade,
   wherein each of said inverters comprises a P-channel MOS transistor and an N-channel MOS transistor connected in series between a first power source and a second power source,
   wherein said delay control signal is supplied to a gate of the P-channel MOS transistor of a first of said three inverters of a first of said unit cells and said reference clock signal is supplied to a gate of the N-channel MOS transistor of the first of said three inverters of said first of said unit cells, and
   wherein said modulator circuit further comprises a capacitor having a first terminal connected to ground and a second terminal connected to a drain of said P-channel MOS transistor of said first of said three inverters of said first of said unit cells and a source of said N-channel MOS transistor of said first of said three inverters of said first of said unit cells.

2. A signal processing circuit comprising:
   a plurality of registers connected in cascade, wherein each of said plurality of registers is supplied with a first clock signal and supplied with an input digital signal;
   an operation processing circuit having an input terminal which receives signals from an input terminal and an output terminal of a final stage of said plurality of registers; and
   a second register supplied with an output signal from said operation processing circuit and a second clock signal;
   wherein said first and second clock signals are formed by phase modulation from a single reference clock signal;
   wherein said phase modulation is performed by a phase modulator circuit comprising:
   a phase comparator for detecting a phase difference between a first signal and said reference clock signal and outputting a signal in accordance with said detection,
   a delay control signal producing circuit for receiving said output signal of the phase comparator and producing a delay control signal in accordance with a voltage level of said phase comparator output signal, and
   a variable phase shifter for receiving the delay control signal, delaying the reference clock signal by an amount of delay in accordance with said delay control signal to generate said first signal;
   wherein said variable phase shifter is formed by a plurality of cells each of which delays said reference clock signal by a predetermined amount.

3. A signal processing circuit comprising:
   a plurality of registers connected in cascade, wherein each of said plurality of registers is supplied with a first clock signal and supplied with an input digital signal;
   an operation processing circuit having an input terminal which receives signals from an input terminal and an output terminal of a final stage of said plurality of registers; and
   a second register supplied with an output signal from said operation processing circuit and a second clock signal;
   wherein said first and second clock signals are formed by phase modulation from a single reference clock signal;
   wherein said phase modulation is performed by a phase modulator circuit comprising:
   a phase comparator for detecting a phase difference between a first signal and said reference clock signal and outputting a signal in accordance with said detection,
   a delay control signal producing circuit for receiving said output signal of the phase comparator and producing a delay control signal in accordance with a voltage level of said phase comparator output signal, and
   a variable phase shifter for receiving the delay control signal, delaying the reference clock signal by an amount of delay in accordance with said delay control signal to generate said first signal;
   wherein said variable phase shifter comprises a cascade connection of a plurality of unit cells comprising inverters for adjusting an amount of delay of said reference clock signal.

4. A signal processing circuit as set forth in claim 3, wherein said unit cells each comprise cascade connections of at least three inverters constituted by a P-channel MOS transistor and an N-channel MOS transistor connected in series between a first power source and a second power source.

5. A signal processing circuit as set forth in claim 4, wherein said delay control signal is supplied to a gate of the P-channel MOS transistor of a first of said three inverters of a first of said unit cells and said reference clock signal is supplied to a gate of the N-channel MOS transistor of the first of said three inverters of said first of said unit cells.

6. A phase modulator circuit as set forth in claim 1, wherein said second terminal of said capacitor is connected to gates of the P-channel MOS transistor and the N-channel MOS transistor of a second inverter of said three inverters of said first of said unit cells.

* * * * *